(12) United States Patent
Wang et al.

(10) Patent No.: US 10,330,242 B1
(45) Date of Patent: Jun. 25, 2019

(54) SUPPORTING APPARATUS AND DISPLAY DEVICE USING THE SAME

(71) Applicant: HONGFUJIN PRECISION ELECTRONICS (CHONGQING) CO., LTD., Chongqing (CN)

(72) Inventors: Te-Hsu Wang, New Taipei (TW); Quan-Guang Du, Chongqing (CN)

(73) Assignee: HONGFUJIN PRECISION ELECTRONICS (CHONGQING) CO., LTD., Chongqing (CN)

( * ) Notice: Subject to any disclaimer, the term of this patent is extended or adjusted under 35 U.S.C. 154(b) by 0 days.

(21) Appl. No.: 15/983,297

(22) Filed: May 18, 2018

(30) Foreign Application Priority Data

Mar. 28, 2018 (CN) .......................... 2018 1 0267986

(51) Int. Cl.
*H05K 7/02* (2006.01)
*H05K 7/04* (2006.01)
*F16M 11/10* (2006.01)
*H05K 5/00* (2006.01)
*H05K 5/02* (2006.01)

(52) U.S. Cl.
CPC ........... *F16M 11/10* (2013.01); *H05K 5/0017* (2013.01); *H05K 5/0204* (2013.01); *H05K 5/0234* (2013.01); *F16M 2200/022* (2013.01)

(58) Field of Classification Search
CPC ............. F16M 11/10; F16M 2200/022; H05K 5/0017; H05K 5/0204; H05K 5/0234
USPC ......................................................... 361/807
See application file for complete search history.

(56) References Cited

U.S. PATENT DOCUMENTS

| | | | | |
|---|---|---|---|---|
| 6,018,847 A * | 2/2000 | Lu | ........................... | F16M 11/10 16/307 |
| 6,671,927 B2 * | 1/2004 | Chen | ..................... | E05D 11/087 16/337 |
| 8,074,956 B2 * | 12/2011 | Wang | ..................... | F16M 13/00 248/133 |
| 8,514,568 B2 * | 8/2013 | Qiao | ..................... | F16M 11/10 248/917 |

* cited by examiner

*Primary Examiner* — Hung S. Bui
(74) *Attorney, Agent, or Firm* — ScienBiziP, P.C.

(57) ABSTRACT

A supporting apparatus allowing a user to rotate a display panel comprises a first bracket and a second bracket. The first bracket and the second bracket cooperate to provide lateral and fore and aft support and allow rotation of the display panel with a friction damping arrangement to allow stable orientation and reorientation of the display panel as desired.

20 Claims, 6 Drawing Sheets

SUPPORTING APPARATUS AND DISPLAY DEVICE USING THE SAME

FIELD

The subject matter herein generally relates a supporting apparatus and a display device using the same.

BACKGROUND

The angle between a display panel and a viewer is crucial to the viewing effect. However, the viewing angle of most monitors cannot be adjusted, and it is not convenient for viewer.

BRIEF DESCRIPTION OF THE DRAWINGS

Implementations of the present disclosure will now be described, by way of example only, with reference to the attached figures.

DETAILED DESCRIPTION

Figure 1:
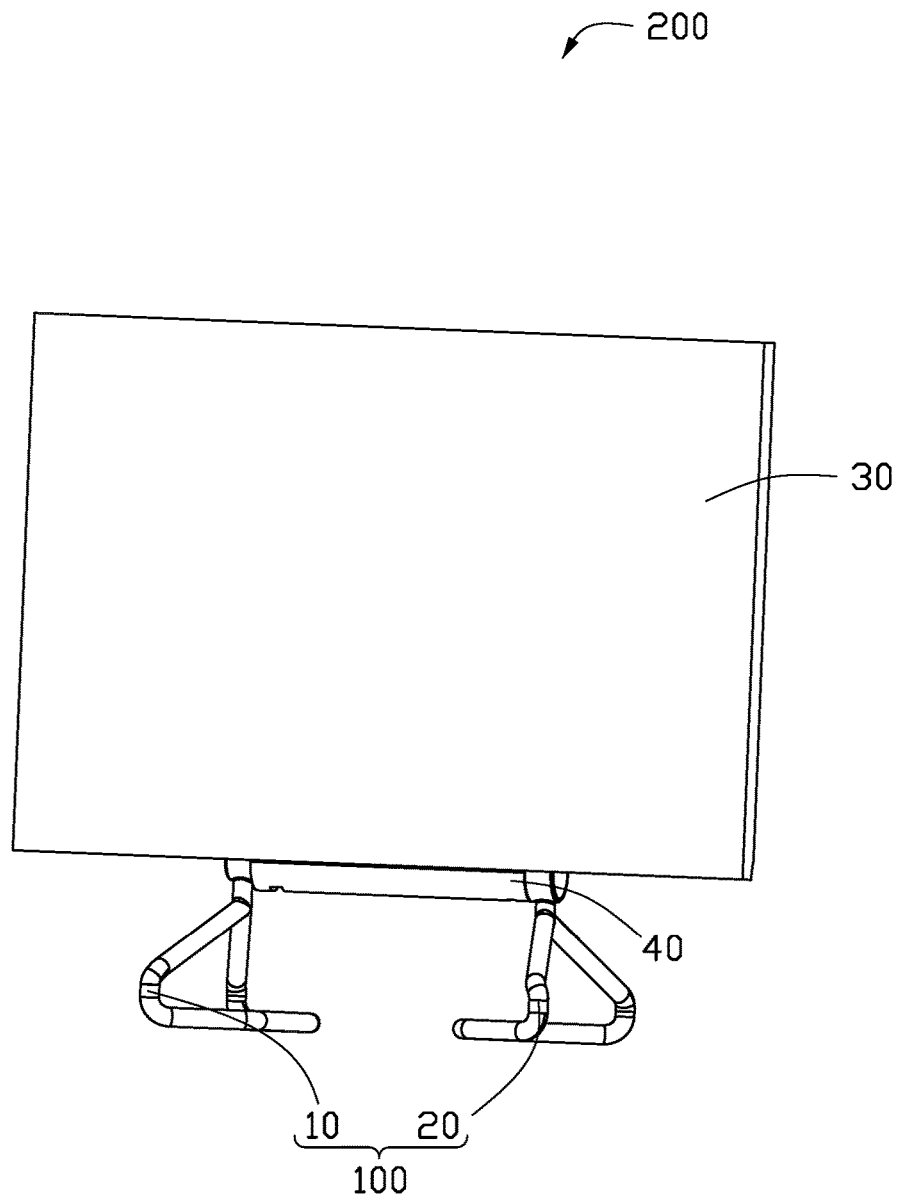
FIG. 1 is an assembled view of an exemplary embodiment of a display device having a supporting apparatus.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising," when utilized, means "including, but not necessarily limited to"; it specifically indicates open-ended inclusion or membership in the so-described combination, group, series, and the like.

Figure 2:
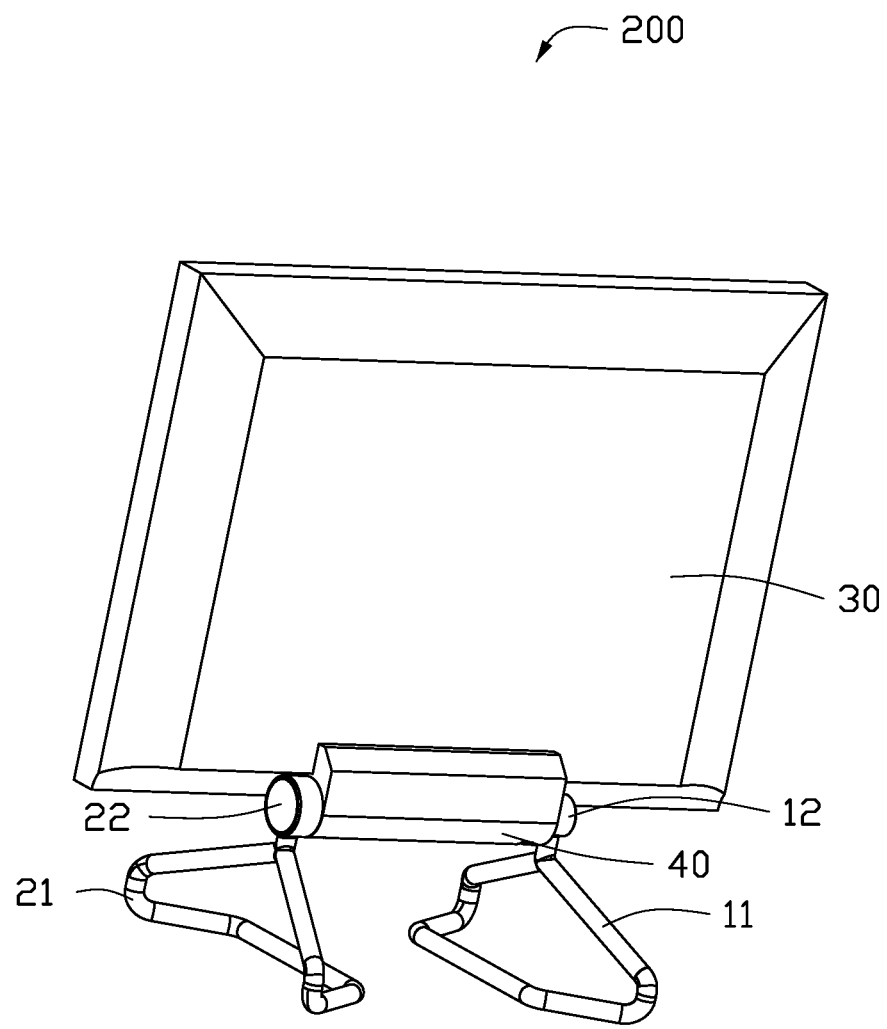
FIG. 2 is similar to FIG. 1, viewed from another angle.
Figure 3:
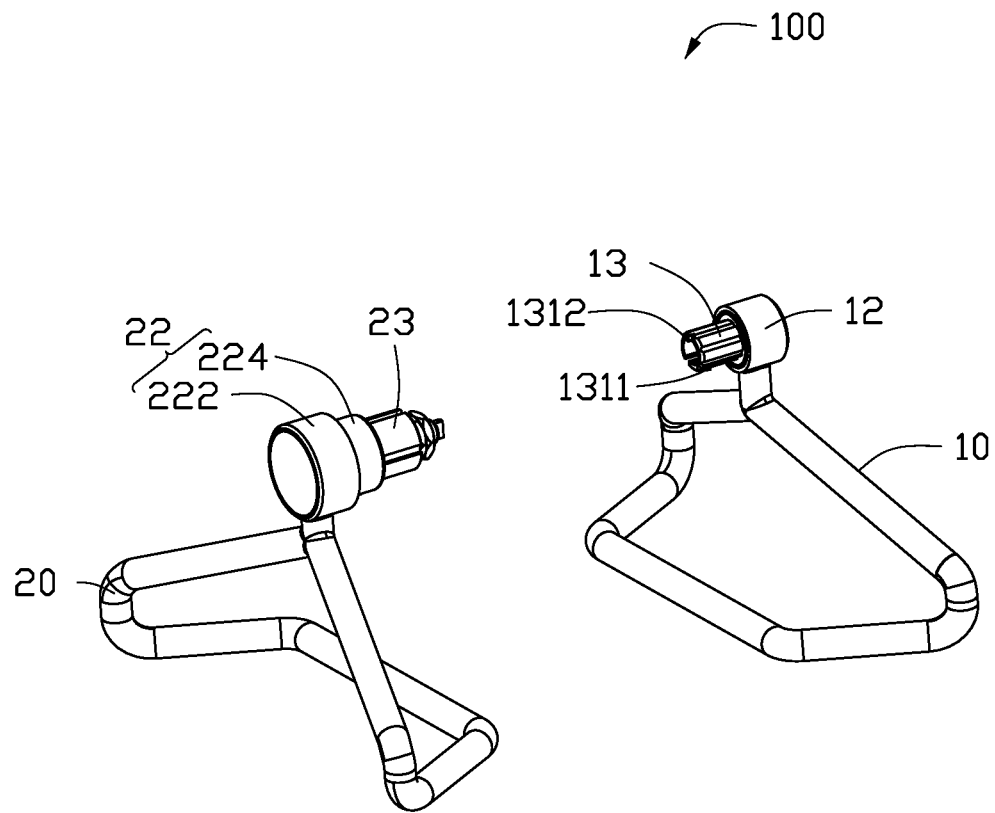
FIG. 3 is an isometric view of the supporting apparatus of FIG. 1.
Figure 4:
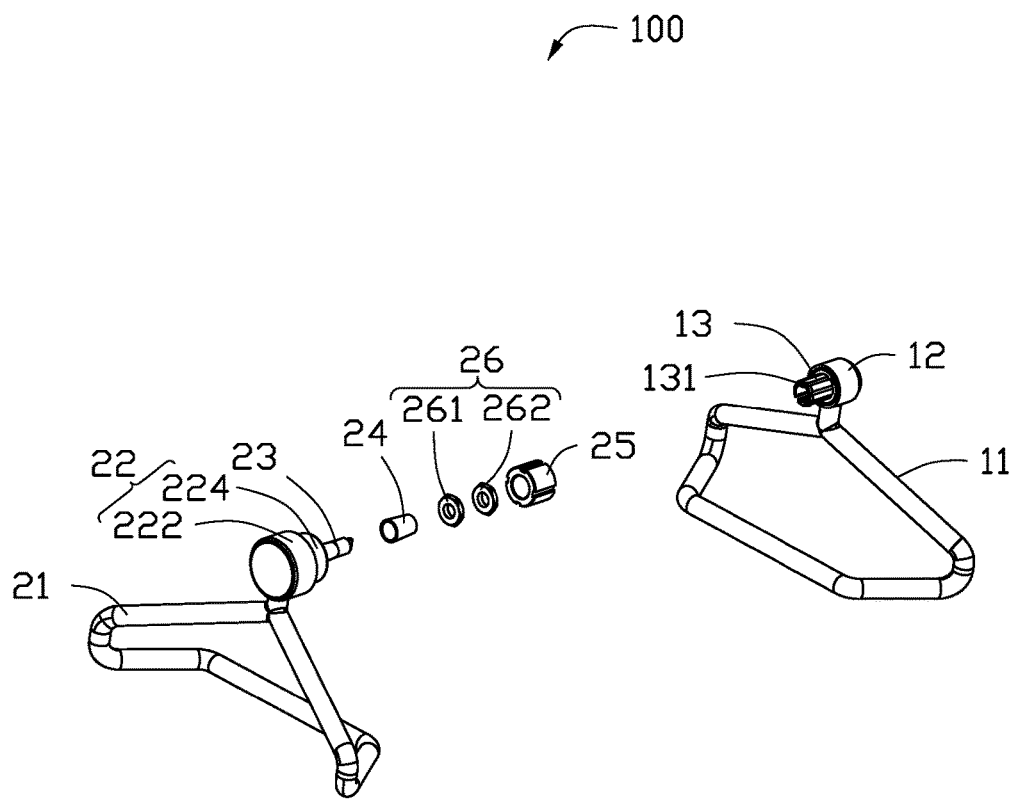
FIG. 4 is an exploded view of the supporting apparatus of FIG. 1.
Figure 5:
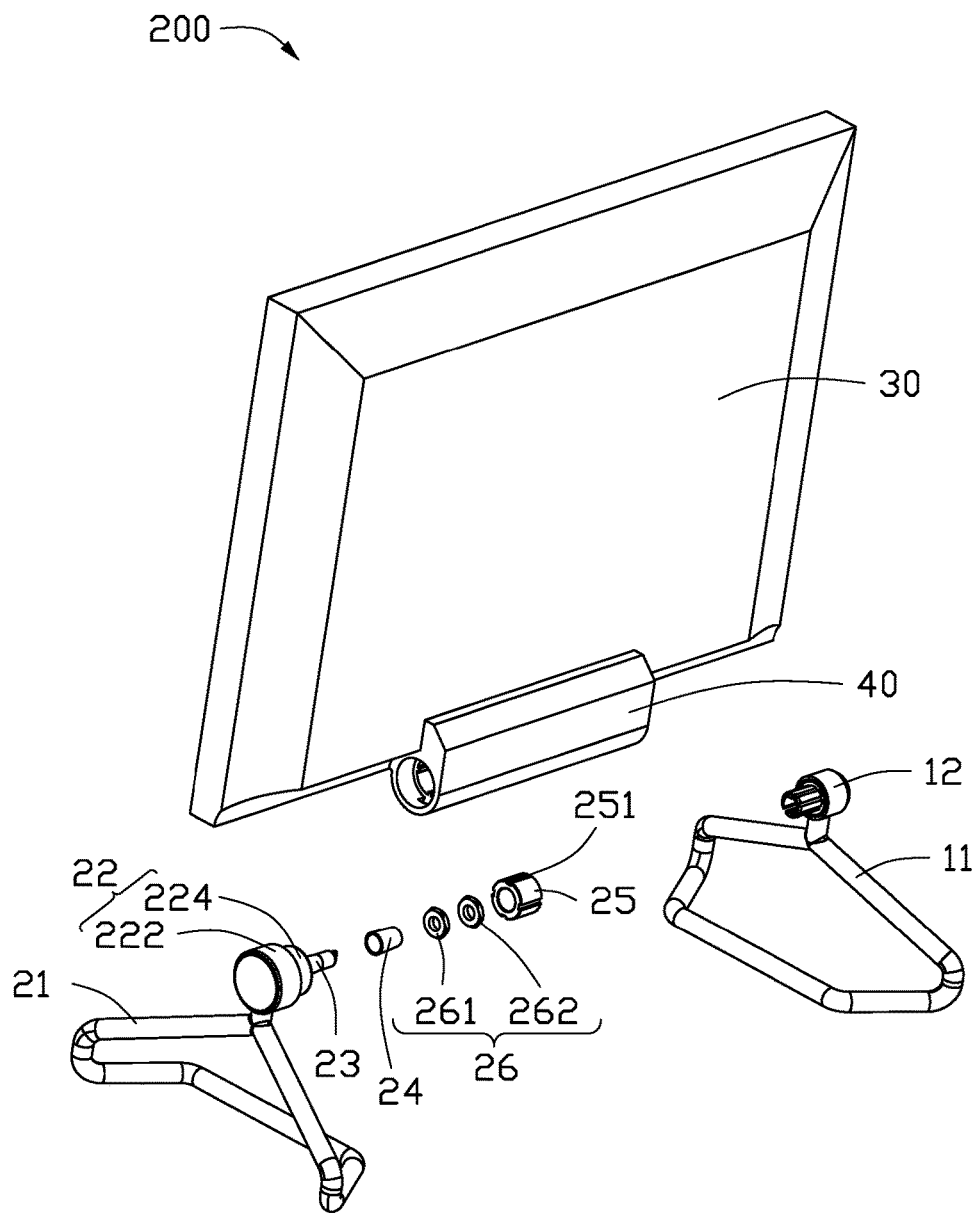
FIG. 5 is an isometric view and enlarged view of parts of the display device of FIG. 1.
Figure 6:
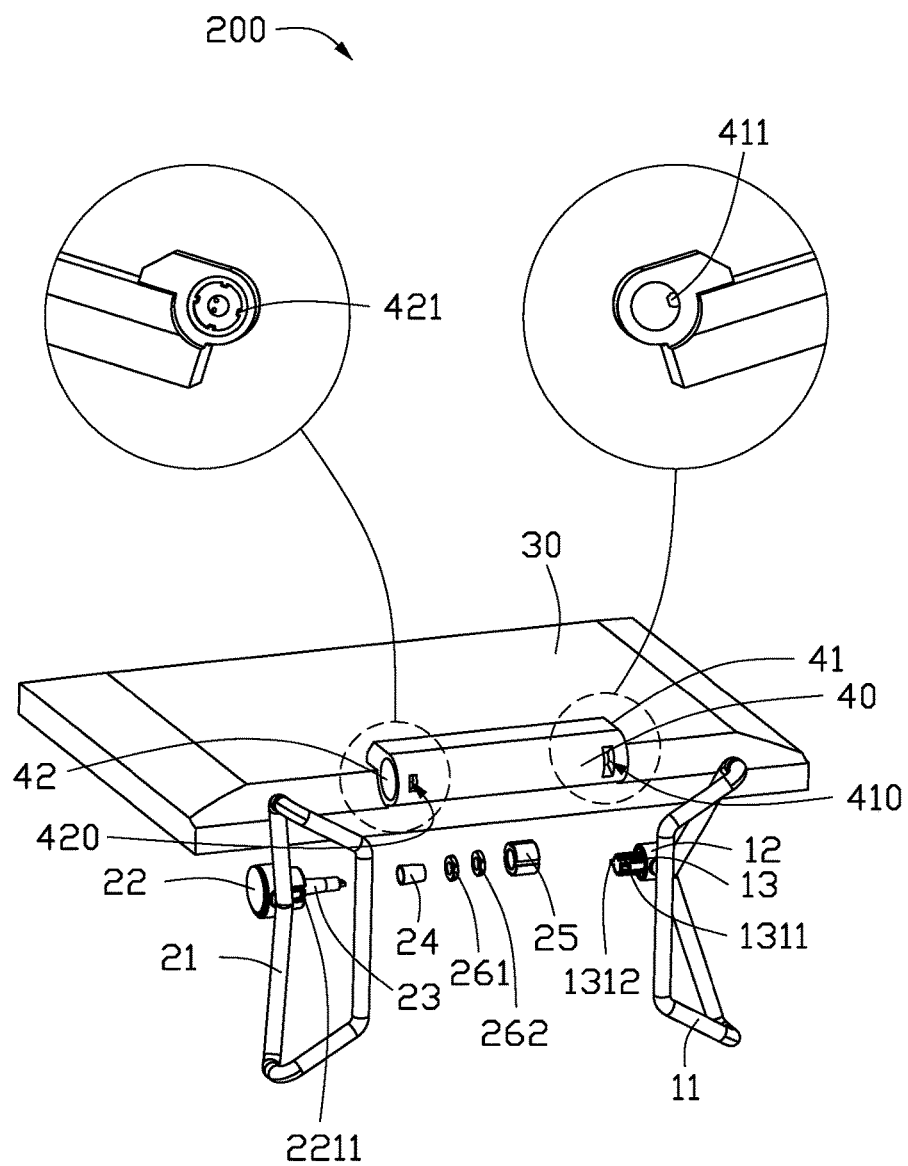
FIG. 6 is an isometric view of the display device of FIG. 5.

FIGS. 1 and 2 illustrate a display device 200 in accordance with an exemplary embodiment of the present application.

The display device 200 comprises a supporting apparatus 100, and a display panel 30. The display panel 30 comprises a base cylinder 40. The supporting apparatus 100 comprises a first bracket 10 and a second bracket 20. The first bracket 10 and the second bracket 20 cooperate to support and allow rotation of the display panel 30.

Referring also to FIGS. 2-6, the first bracket 10 comprises a first supporting portion 11, a first securing portion 12, and a first rotating portion 13. The first supporting portion 11 is located below the first bracket 10, and the first securing portion 12 and the first rotating portion 13 are located above the first bracket 10. The first securing portion 12 is fixedly connected with the first rotating portion 13.

A mounting portion 131 is located on the end of the first rotating portion 13. The mounting portion 131 matches the base cylinder 40.

The mounting portion 131 comprises a first hook 1311 and a convex portion 1312. The first hook 1311 is configured to fix the position of the first rotating portion 13, and the convex portion 1312 is configured to limit the rotation angle of the first rotating portion 13.

The second bracket 20 comprises a second supporting portion 21, a second securing portion 22, a second rotating portion 23, a friction member 24, a rotating member 25, and two locking members 26.

The second supporting portion 21 is located below the second bracket 20, and the second securing portion 22 and the second rotating portion 23 are located above the second bracket 20. The second securing portion 22 is fixedly connected with the second rotating portion 23. The rotating member 25 is sleeved on the second rotating portion 23. The friction member 24 is sleeved between the second rotating portion 23 and the rotating member 25. The locking member 26 is fixed to the end of the second rotating portion 23, to fix the rotating member 25.

In at least one exemplary embodiment, the first bracket 10 and the second brackets 20 are substantially a mirror image of each other.

In at least one exemplary embodiment, the first securing portion 12 and the first rotating portion 13 are cylinders. A diameter of the first securing portion 12 is greater than a diameter of the first rotating portion 13. The second securing portion 22 comprises a first cylinder 222 and a second cylinder 224. The first cylinder 222 connects to the second cylinder 224, and a diameter of the first cylinder 224 is greater than a diameter of the second cylinder 222.

In at least one exemplary embodiment, the first rotating portion 13 is a third cylinder (not shown). The third cylinder connects to the second cylinder, and a diameter of the third cylinder is less than the diameter of the second cylinder.

The second securing portion 22 comprises a second hook 2211, and the second hook 2211 is configured to fix the position of the second rotating portion 23.

In at least one exemplary embodiment, the friction member 24 is a hollow cylindrical structure. An inside diameter of the friction member 24 is greater than a diameter of the second rotating portion 23, and an outside diameter of the friction member 24 is less than the diameter of the second cylinder.

The rotating member 25 is a hollow cylindrical structure. An inside diameter of the rotating member 25 is greater than the outside diameter of the friction member 24, and an outside diameter of the rotating member 25 is less than the diameter of the second cylinder.

The friction member 24 is located between the rotating member 25 and the second rotating portion 23. The friction member 24 can rotate relative to the second rotating portion 23. The friction member 24 is configured to apply and control rotation resistance between the rotating member 25 and the second rotating portion 23.

The locking member 26 comprises a first nut 261 and a second nut 262, and a size of the first nut 261 is the same as a size of the a second nut 262.

Both the first nut 261 and the second nut 262 can pass through the end of the second rotating portion 23. The second nut 262 is engaged with the rotating member 25, and the first nut 261 is engaged with the second nut 262. The second nut 262 is configured to fix the rotation angle of the second rotating portion 23.

The base cylinder 40 is a hollow structure, and a first groove 41 and a second groove 42 are defined on the sides of the base cylinder 40. A sliding slot 251 is located on the outer side of the rotating member 25 to cooperate with the base cylinder 40.

The first groove 41 defines a first slot 410 and a notch 411. The first slot 410 matches the first hook 1311, and the notch 411 matches the convex portion 1312.

The second groove 42 defines a second slot 420 and a sliding block 421. The second slot 420 matches the second hook 2211, the sliding block 421 matches the sliding slot 251. The sliding block 421 can rotate relative to the second groove 42.

When the first rotating portion 13 is inserted into the first groove 41, the first hook 1311 is engaged with the first slot 410.

When the second rotating portion 23 is inserted into the second groove 42, the second hook 2211 is engaged with the second slot 420. The second rotating portion 23 can rotate relative to the second groove 42, and the sliding block 421 is fixed in the sliding slot 251. In this way, both the sliding block 421 and the sliding slot 251 can rotate relative to the second groove 42.

The exemplary embodiments shown and described above are only examples. Many details are often found in the art such as the other features of supporting apparatus and display device. Therefore, many such details are neither shown nor described.

Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the exemplary embodiments described above may be modified within the scope of the claims.

What is claimed is:

1. A supporting apparatus configured for supporting and rotating a display panel and comprising:
   a first bracket comprising a first supporting portion, a first securing portion and a first rotating portion, the first securing portion connecting to the upper portion of the first supporting portion, the first rotating portion comprising a first end and a second end, the first end of the first rotating portion connecting to the first securing portion, the second end of the first rotating portion comprising a mounting portion, and the mounting portion matching the display panel; and
   a second bracket comprising a second supporting portion, a second securing portion, a second rotating portion, a friction member, a rotating member, and a locking member, the second securing portion connecting to the upper portion of the second supporting portion, the rotating member sleeving on the second rotating portion, the friction member sleeving between the second rotating portion and the rotating member;
   wherein the locking member fixes to an end of the second rotating portion to fix the rotating member, and a sliding slot is located on the outer side of the rotating member to cooperate with the display panel.

2. The supporting apparatus of claim 1, wherein both the first securing portion and the first rotating portion are cylinders, and a diameter of the first securing portion is greater than a diameter of the first rotating portion.

3. The supporting apparatus of claim 2, wherein the mounting portion comprises a first hook and a convex portion, the first hook is configured to fix the position of the first rotating portion, and the convex portion is configured to limit the rotation angle of the first rotating portion.

4. The supporting apparatus of claim 3, wherein the second securing portion comprises a first cylinder and a second cylinder, the first cylinder connects to the second cylinder, and a diameter of the first cylinder is greater than a diameter of the second cylinder.

5. The supporting apparatus of claim 4, wherein the first rotating portion connects to the second cylinder.

6. The supporting apparatus of claim 5, wherein the second securing portion comprises a second hook, and the second hook is configured to fix the position of the second rotating portion.

7. The supporting apparatus of claim 6, wherein the friction member is a hollow cylinder structure, an inside diameter of the friction member is greater than a diameter of the second rotating portion, and an outside diameter of the friction member is less than the diameter of the second cylinder.

8. The supporting apparatus of claim 7, wherein the rotating member is a hollow cylinder structure, an inside diameter of the rotating member is greater than the outside diameter of the friction member, and an outside diameter of the rotating member is less than the diameter of the second cylinder.

9. The supporting apparatus of claim 8, wherein the friction member is located between the rotating member and the second rotating portion, the friction member rotates relative to the second rotating portion, the friction member is configured to control the rotation resistance between the rotating member and the second rotating portion.

10. The supporting apparatus of claim 9, wherein the locking member comprises a first nut and a second nut, and a size of the first nut is the same as a size of the second nut.

11. The supporting apparatus of claim 10, wherein the second nut is engaged with the rotating member, the first nut is engaged with the second nut, and the second nut is configured to fix the rotation angle of the second rotating portion.

12. A display device comprising:
   a display panel comprising a base cylinder; and
   a supporting apparatus comprising:
      a first bracket comprising a first supporting portion, a first securing portion and a first rotating portion, the first securing portion connecting to the upper portion of the first supporting portion, the first rotating portion comprising a first end and a second end, the first end of the first rotating portion connecting to the first securing portion, the second end of the first rotating portion comprising a mounting portion, and the mounting portion matching the display panel; and a second bracket comprising a second supporting portion, a second securing portion, a second rotating portion, a friction member, a rotating member, and a locking member, the second securing portion connecting to the upper portion of the second supporting portion, the rotating member sleeving on the second rotating portion, the friction member sleeving between the second rotating portion and the rotating member; wherein the locking member fixes to an end of the second rotating portion to fix the rotating member, and a sliding slot is located on the outer side of the rotating member to cooperate with the display panel;

wherein two sides of the base cylinder are respectively defined a first groove and a second groove, the first groove defines a first slot and a notch, the first slot matches with the first hook, and the notch matches with the convex portion, the second groove defines a second slot and a sliding block, the second slot matches with the second hook, the sliding block matches with the sliding slot, and the sliding block rotates relative to the second groove.

13. The display device of claim 12, wherein both the first securing portion and the first rotating portion are cylinders, and a diameter of the first securing portion is greater than a diameter of the first rotating portion.

14. The display device of claim 13, wherein the mounting portion comprises a first hook and a convex portion, the first hook is configured to fix the position of the first rotating portion, and the convex portion is configured to limit the rotation angle of the first rotating portion.

15. The display device of claim 14, wherein the second securing portion comprises a first cylinder and a second cylinder, the first cylinder connects to the second cylinder, and a diameter of the first cylinder is greater than a diameter of the second cylinder; wherein the first rotating portion connects to the second cylinder.

16. The display device of claim 15, wherein the second securing portion comprises a second hook, and the second hook is configured to fix the position of the second rotating portion.

17. The display device of claim 16, wherein the friction member is a hollow cylinder structure, an inside diameter of the friction member is greater than a diameter of the second rotating portion, and an outside diameter of the friction member is less than the diameter of the second cylinder.

18. The display device of claim 17, wherein the rotating member is a hollow cylinder structure, an inside diameter of the rotating member is greater than the outside diameter of the friction member, and an outside diameter of the rotating member is less than the diameter of the second cylinder.

19. The display device of claim 18, wherein the friction member is located between the rotating member and the second rotating portion, the friction member rotates relative to the second rotating portion, the friction member is configured to control the rotation resistance between the rotating member and the second rotating portion.

20. The display device of claim 19, wherein the locking member comprises a first nut and a second nut, and a size of the first nut is the same as a size of the second nut; wherein the second nut is engaged with the rotating member, the first nut is engaged with the second nut, and the second nut is configured to fix the rotation angle of the second rotating portion.

\* \* \* \* \*